United States Patent
Chen et al.

(10) Patent No.: US 8,062,951 B2
(45) Date of Patent: Nov. 22, 2011

(54) METHOD TO INCREASE EFFECTIVE MOSFET WIDTH

(75) Inventors: Xiangdong Chen, Poughquag, NY (US); Kenneth J. Stein, Sandy Hook, CT (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 11/953,445

(22) Filed: Dec. 10, 2007

(65) Prior Publication Data
US 2009/0146263 A1  Jun. 11, 2009

(51) Int. Cl.
*H01L 29/76* (2006.01)
(52) U.S. Cl. .................... 438/424; 438/701
(58) Field of Classification Search .......... 438/424, 438/701
See application file for complete search history.

(56) References Cited

U.S. PATENT DOCUMENTS

| | | | |
|---|---|---|---|
| 5,643,822 A | 7/1997 | Furukawa et al. | |
| 6,700,205 B2 | 3/2004 | Tang et al. | |
| 6,960,514 B2* | 11/2005 | Beintner et al. | 438/424 |
| 7,312,485 B2* | 12/2007 | Armstrong et al. | 257/255 |
| 2005/0167777 A1* | 8/2005 | Lee | 257/510 |
| 2005/0199984 A1* | 9/2005 | Nowak | 257/627 |
| 2006/0228862 A1 | 10/2006 | Anderson et al. | |
| 2006/0244036 A1 | 11/2006 | Wu | |

* cited by examiner

*Primary Examiner* — Samuel Gebremariam
(74) *Attorney, Agent, or Firm* — H. Daniel Schnurmann

(57) ABSTRACT

An epitaxial layer of silicon (Si) or silicon-germanium (SiGe) extends over the edge of silicon trench isolation (STI), thereby increasing the effective width of an active silicon region (RX) bordered by the STI. The RX region may have a <100> crystal orientation. An effective width of an FET device formed in the RX region may be increased, therefore performance may be improved with same density. Isolation may not be degraded since RX-to-RX distance is same at bottom. Junction capacitance may be reduced since part of the RX is on STI.

8 Claims, 4 Drawing Sheets

METHOD TO INCREASE EFFECTIVE MOSFET WIDTH

FIELD OF THE INVENTION

The invention relates to the manufacture of semiconductor devices and, more particularly, field effect transistors (FETs) and, more particularly, to trench-isolated FETs.

BACKGROUND OF THE INVENTION

U.S. Pat. No. 5,643,822 (IBM, 1997), incorporated by reference in its entirety herein, discloses a method for forming trench-isolated field effect transistor (FET) devices.

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET, a small amount of voltage is applied to the gate (G) in order to control current flowing between the source (S) and drain (D). In FETs, the main current appears in a narrow conducting channel formed near (usually primarily under) the gate. This channel connects electrons from the source terminal to the drain terminal. The channel conductivity can be altered by varying the voltage applied to the gate terminal or by enlarging or constricting the conducting channel and thereby controlling the current flowing between the source and the drain.

FIGS. 1A and 1B illustrate an exemplary, conventional field effect transistor (FET) 100. FIG. 1A is a plan view, and FIG. 1B is a cross-sectional view taken on a line 1B-1B through FIG. 1A.

The FET 100 is formed upon a semiconductor substrate 102, and more particularly within a cell well (CW) portion of the substrate 102. The cell well (CW) is a region of the substrate 102 which has been doped, for example, to be an "n-well" within a "p-type" substrate.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith.

While particular n- and p-type dopings are described herein according to NMOS technology, it is to be appreciated that one or more aspects of the present invention are equally applicable to forming a PMOS (generally, simply by reversing the n- and p-type dopings).

As best viewed in FIG. 1B, the FET 100 comprises a p-type substrate, and two spaced-apart n-type diffusion areas—one of which will serve as the "source", the other of which will serve as the "drain" of the transistor. The space between the two diffusion areas is called the "channel". The channel is where current flows, between the source (S) and the drain (D). A schematic symbol for an n-channel MOSFET appears to the left of FIG. 1B.

A thin dielectric layer is disposed over the substrate in the neighborhood of the channel, and a "gate" structure (G) is disposed over the dielectric layer atop the channel. (The dielectric under the gate is also commonly referred to as "gate oxide" or "gate dielectric".) Electrical connections (not shown) may be made to the source (S), the drain (D), and the gate (G). The substrate may be grounded.

Generally, when there is no voltage applied to the gate, there is no electrical conduction (connection) between the source and the drain. As voltage (of the correct polarity, plus or minus) is applied to the gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

As best viewed in FIG. 1A, a trench, labeled "STI" surrounds a single FET 100. "STI" is short for silicon (or shallow) trench isolation, and generally involves forming (such as by etching into the surface of the substrate) a trench around the FET, and filing (such as by deposition) the trench with an insulating material such as silicon dioxide (commonly referred to simply as "oxide").

Although only one STI trench (and a corresponding one FET) is shown in FIG. 1A, it should be understood that the trench may be formed by several intersecting, parallel trenches (like a tic-tac-toe board), as indicated by the dashed lines. The STI insulates (electrically isolates) the enclosed FET from other, neighboring FETs. The area within the trench is referred to as the active silicon region, and is often referred to as "RX". Generally, there is minimum width (Wm) for the STI trench for each technology (the width of the trench has to be larger Wm for the technology), and the minimum width and RX width scales 70% for each generation. STI is omitted from the view of FIG. 1B, for illustrative clarity.

FIG. 2 is a cross-section of a portion of a semiconductor substrate 202 having a top surface 202a and a bottom surface 202b. Three STI trenches are illustrated (and labeled "STI"), and two active silicon regions (labeled "RX") enclosed by the STR trenches are illustrated.

A given STI trench has sidewalls 204, and a bottom surface 206, and extends into the substrate 202, from the top surface 202a thereof, a distance "D" towards the bottom surface 202b of the substrate 202. The trench has a width dimension "W1" at the top surface 202a of the substrate 202, and a width dimension "W2" at its bottom end 206. The trench may be tapered, such as by an angle "a" of 5 degrees, resulting in the dimension W2 being slightly less than the dimension W1. A given active silicon area RX between two trenches may have a width of "W3". A "pitch" dimension (also referred to as "RX-to-RX" distance, or pitch) may be defined as the distance "W4" between two identical points (such as the center of) two adjacent trenches. A cell well "CW" is generally formed in the substrate 202, between and extending slightly below the STI trenches. Exemplary dimensions for the STI and RX are:

W1=50-500 nm
W2=30-500 nm
W3=50-500 nm
W4=100-1000 nm.

The CMOS technology is keeping the 70% scaling in both PC (gate) pitch and width to increase density and reduce cost. (For the next generation, most of the dimension scales 70% compared with previous generation. For example, the typical RX width at 65 nm generation is 500 nm, it will be 350 nm at 45 nm technology.) As the width is scaled down, the drive capability is reduced and it will affect the performance and circuit stability. One way to keep the same density and increase the device width is to reduce the STI width, but keep the same RX pitch (W4). But it will make it very difficult to fill the STI and also keep good isolation.

SUMMARY OF THE INVENTION

It is a general object of the invention to provide an improved technique for fabricating STI-isolated FETs.

According to the invention, generally, the effective width of an active silicon region (RX) bordered by STI is increased by disposing an epitaxial silicon layer on the substrate, overhanging the trench. Lateral growth of the epitaxial layer may be facilitated when the RX has <100> crystal orientation.

A silicon (Si) or silicon-germanium (SiGe) epitaxy may be done after the RX (litho and etch) process and STI fill. Due to lateral growth, SiGe was grown above the STI region to increase the effective RX width.

In this manner, the effective device width can be increased, while keeping the same RX pitch, STI width and same well isolation.

According to an embodiment of the invention, a substrate for forming a field effect transistor (FET) comprises a silicon substrate; silicon trench isolation (STI) comprising a trench defining an active silicon area (RX); and an epitaxial layer on said substrate, extending over an edge of the trench. The RX region may have a <100> crystal orientation. The epitaxial layer may comprise silicon (Si) or silicon-germanium (SiGe). The epitaxial layer may have a thickness of 5-20 nm and extends over the edge of the trench by 5-20 nm.

According to an embodiment of the invention, a method of preparing a substrate for fabricating a field effect transistor (FET), comprises: forming an STI trench; and forming an epitaxial layer comprising silicon on a surface of the substrate, and extending partially over the STI trench. The epitaxial layer may comprise silicon (Si) or silicon-germanium (SiGe), may be grown after STI trench formation and fill, and may constitutes an active silicon region (RX) extending over the STI trench.

According to an embodiment of the invention, a method of fabricating a field effect transistor (FET), comprises: providing a silicon substrate having a surface; etching to form STI trenches extending into the substrate from the surface thereof, filling the trenches with oxide; and forming an epitaxial layer comprising silicon on a surface of the substrate, and extending partially over the STI trenches. The substrate may have a <100> crystal orientation. The substrate may comprise a pad oxide layer on the surface of the substrate and a nitride layer over the pad oxide layer. Prior to etching to form the STI trenches, openings may be formed through the nitride layer and pad oxide layer, said openings extending to the surface of the substrate. After filling the trenches with oxide, a chemical mechanical polishing (CMP) step may be performed.

Some features and/or advantages of the invention may include:

Si or SiGe epitaxy growth after STI formation and fill.
Due to lateral overgrowth, there is RX over STI.
Effective W of the device is increased, therefore performance may be improved with same density.
Isolation is not degraded since RX-to-RX distance is same at bottom.

Junction capacitance may be reduced since part of the RX is on STI.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Figure 1A:
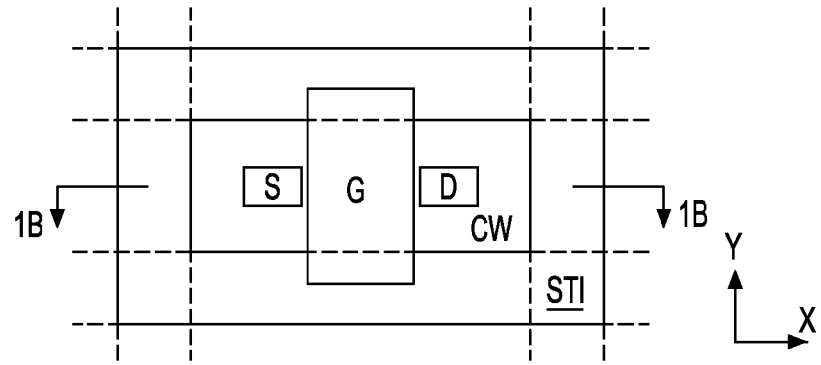

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

Figure 2:
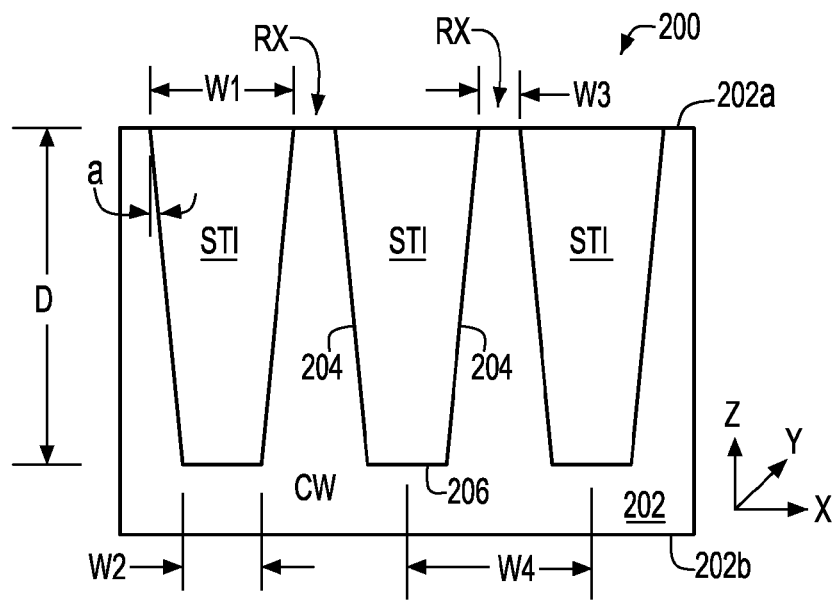

FIG. 1A is a plan view of a field effect transistor (FET), according to the prior art.

Figure 1B:
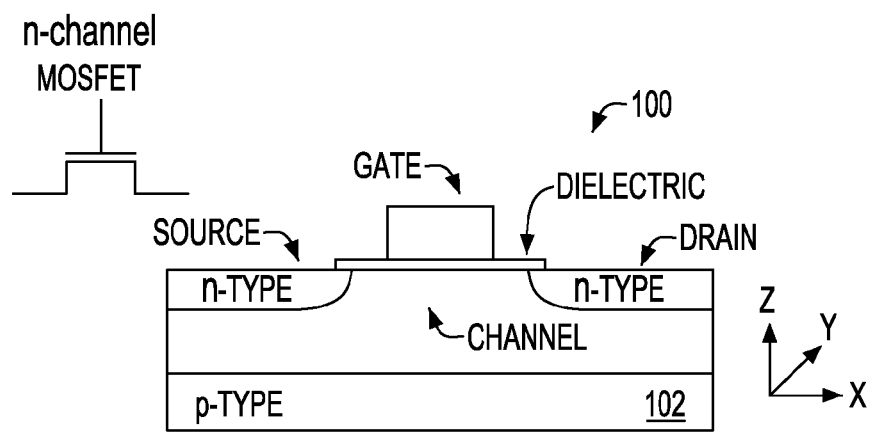

FIG. 1B is a cross-sectional view taken on a line 1B-1B through FIG. 1A.

FIG. 2 is a cross-section of a semiconductor substrate having STI trenches, according to the prior art.

FIGS. 3A-3G are cross-sectional views of a sequence of process steps involved in fabricating a substrate with STI trenches and an active silicon region (RX) for forming a semiconductor device, such as a FET, according to an embodiment of the invention.

Figure 3A:
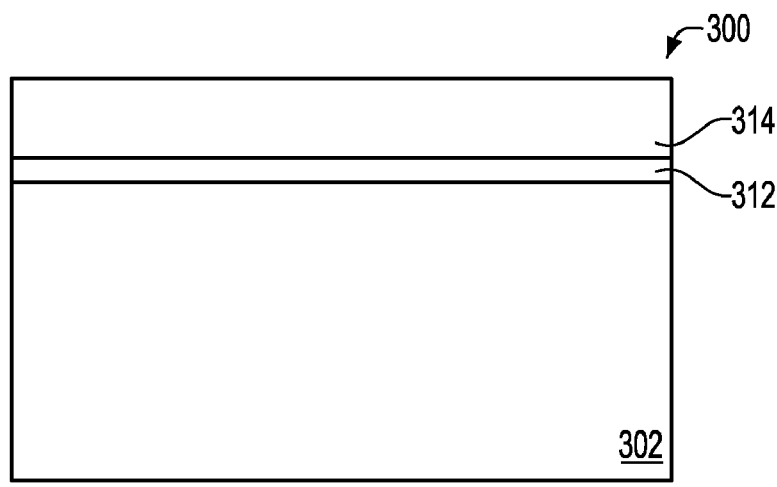
Figure 3B:
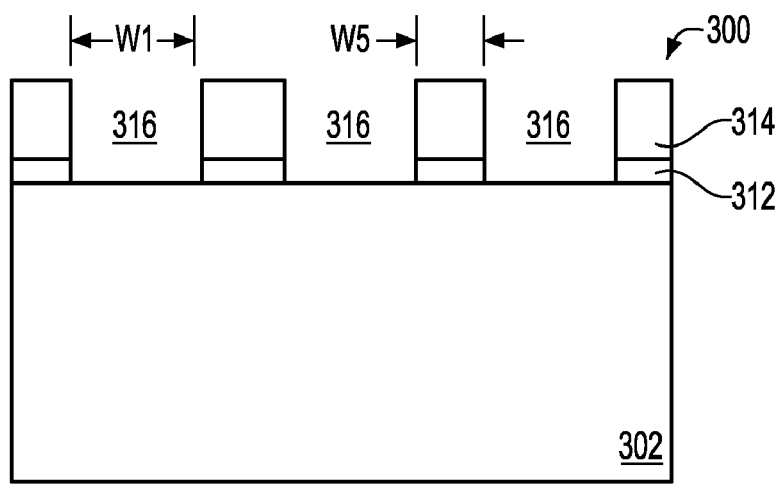
Figure 3C:
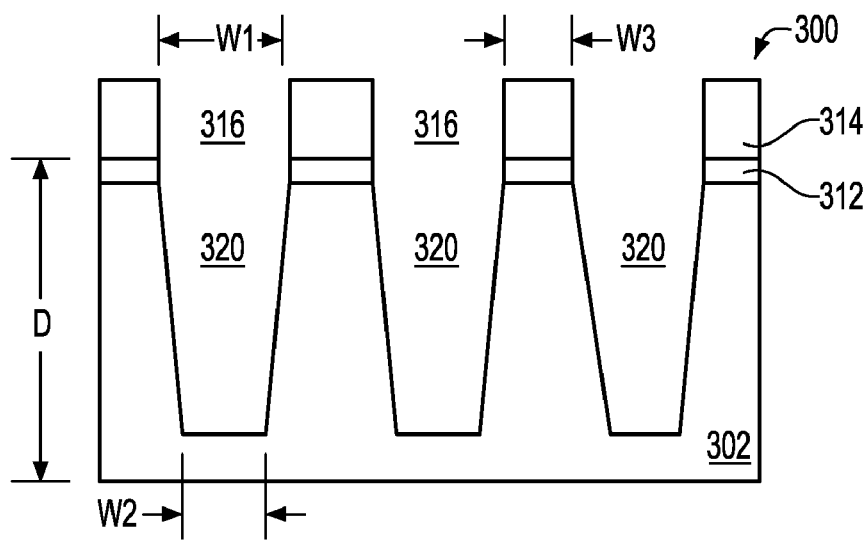
Figure 3D:
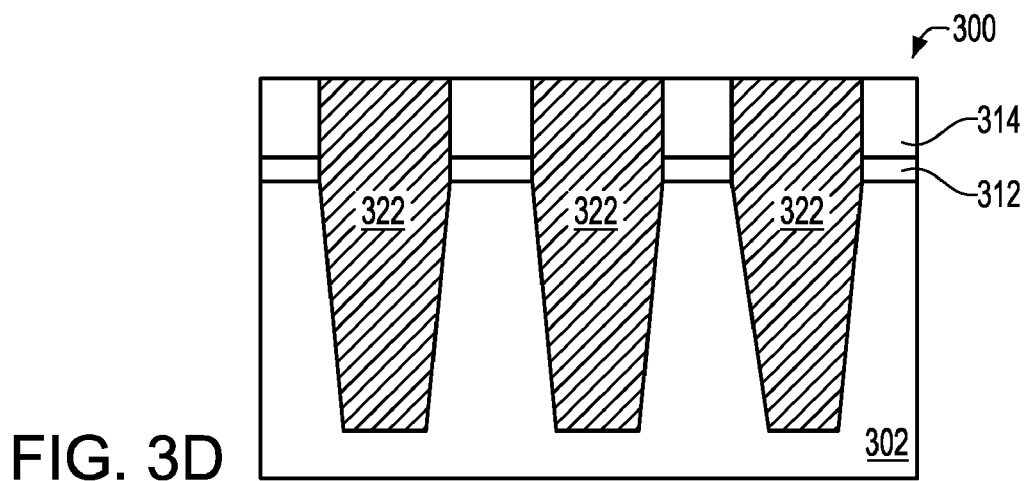
Figure 3E:
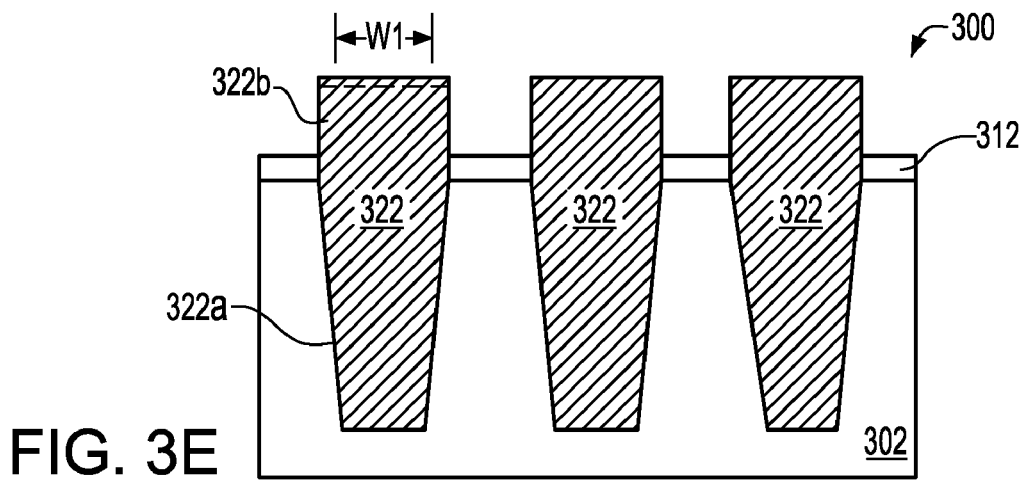
Figure 3F:
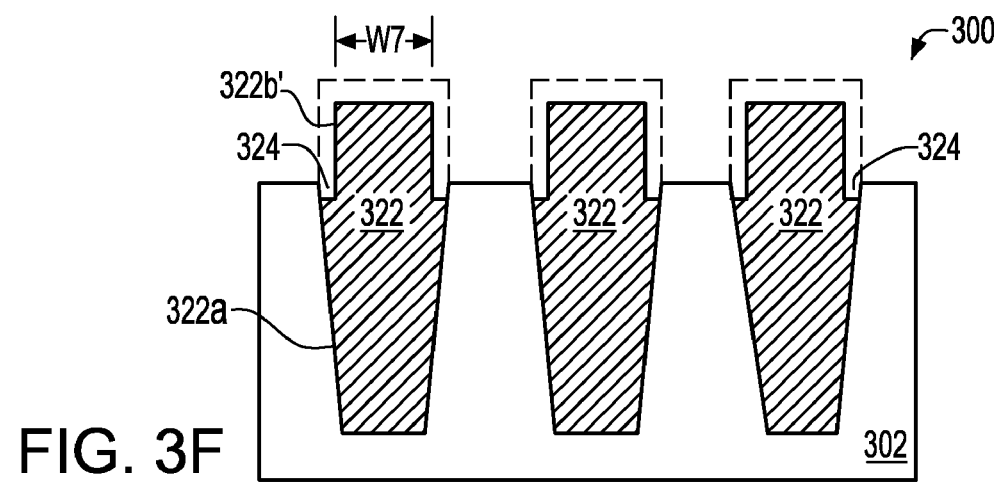
Figure 3G:
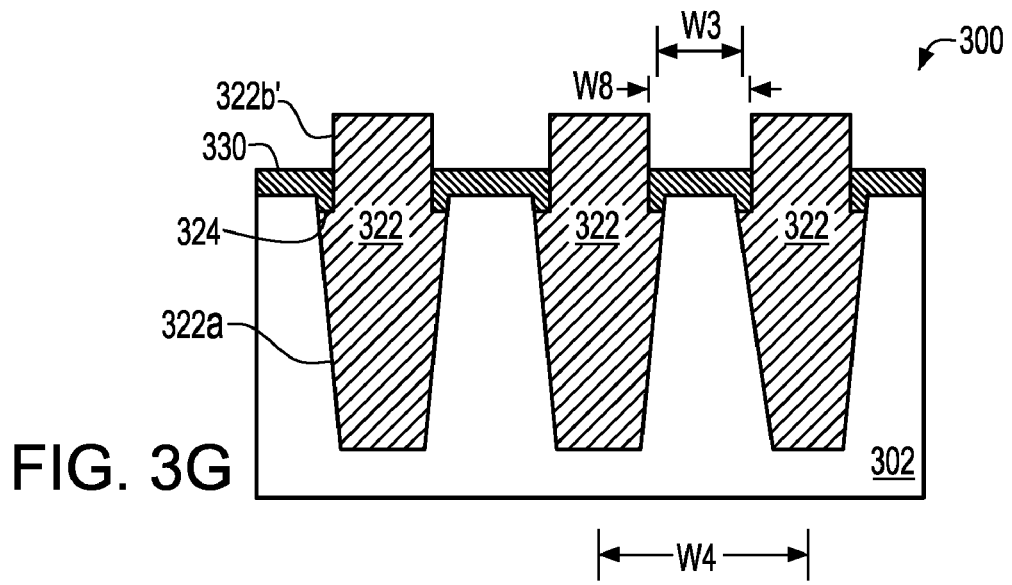
Figure 3H:
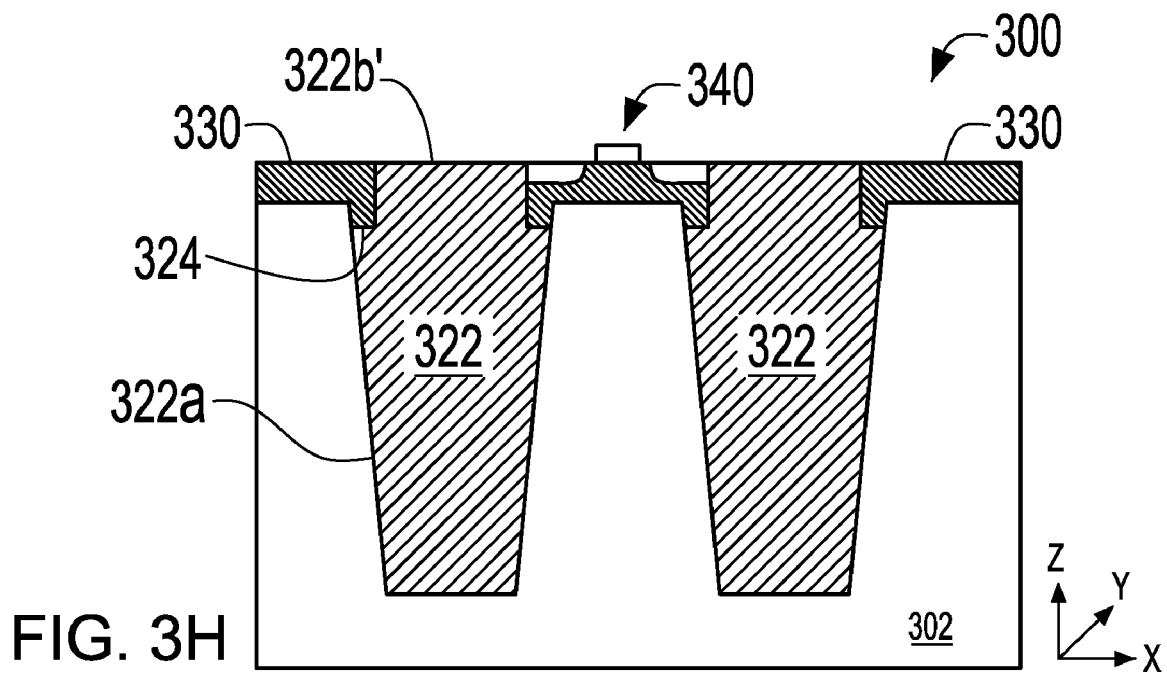

FIG. 3H is a cross-sectional view of a substrate with STI trenches, and an FET formed on the substrate, according to an embodiment of the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

FIGS. 3A-3G are cross-sectional views of a sequence of steps in a process 300 for fabricating a substrate with STI trenches and an active silicon region (RX) for forming a semiconductor device, such as an FET, according to an embodiment of the invention. The process is designated "300".

FIG. 3A illustrates a substrate 302 (compare 102, 202), which may be a conventional silicon wafer having a <100> crystal orientation, such as [001] wafer rotated 45-degrees to have the <100> orientation in the x-axis (left to right, in the figure).

The substrate 302 has a thin layer 312 of "pad" oxide deposited on its top surface, and a thin layer 314 of "pad" nitride deposited on the layer 312 of pad oxide. The pad oxide may have an exemplary thickness of 10 nm (100 Angstroms), and the pad nitride may have an exemplary thickness of 100 nm (1000 Angstroms).

FIG. 3B illustrates a next step in the process. Conventional processes are performed (apply and pattern resist, etch, remove resist) to create (form) an opening 316 through the nitride layer 314 and the oxide layer, the openings 316 extending to the surface of the substrate 302. The remaining pattern of nitride structures 314 may function as a hard mask, for subsequent etching of the substrate.

The opening 316 is ring-shaped and will define an STI trench (320) that will be formed, and the central remaining nitride corresponds generally to an active silicon region (RX) where a trench-isolated FET will be formed. (It should be realized that the two openings 316 may be two sides, in cross-section, of one overall square ring-shaped opening).

The remaining nitride 314 may have an exemplary width W5 of 50-500 nm (compare W3), and the opening 316 may have an exemplary width W6 of 50-500 nm (compare W1). Hence, an "initial RX" is W5.

FIG. 3C illustrates a next step in the process. An etch is performed, such as a wet etch, to form "STI" trenches 320 extending into the substrate 302 from the surface thereof. This may be a timed etch.

For purposes of this discussion, the trenches 320 in the substrate 302 may have dimensions substantially identical to the STI trenches in the substrate 202 shown and described in FIG. 2. This would include the width W1 across the top of the trench, the depth D of the trench, and the width W2 across the bottom of the trench. Therefore, the dimension W5 may be equal to the dimension W3, and the dimension W6 may be equal to the dimension W1. The dimensions W1, D, and W2 will be applied to the trenches 320.

The trenches 320 may extend a distance "D" (same as in FIG. 2), approximately 300 nm into the substrate. The trenches 320 may be tapered, approximately 80-85 degrees. Therefore, the width W2 at the bottom of a trench will generally be slightly less than the width W1 across the top of the trench.

The width W1 of the top of the trenches 320, at the surface of the substrate, is substantially equal to W6, and may be 100-500 nm (0.1-0.5 μm).

For a tapered trench 320 having a top width W6 of 0.50 μm (500 nm), the width W2 at the bottom of the trench may, for example, be 0.48 μm (480 nm).

Although the trench widths are illustrated as being equal to one another, they can be any width larger than the minimum required width (Wm).

Another dimension of interest is the distance between the tops of the trenches, previously (in FIG. 2) referred to as the active silicon area RX and having a width W3.

FIG. 3D illustrates a next step in the process. The trenches 320 are filled with an insulating material 322, such as oxide. This may be a process of overfilling the trenches 320, then performing a chemical mechanical polishing (CMP) step to remove excess oxide overlying the nitride, resulting in the substantially planar top surface shown in FIG. 3D. The minimum trench width (W1, W2) is generally dependent on how well the trench can be filled.

FIG. 3E illustrates a next step in the process. The pad nitride 314 is stripped, such as with a wet etch. And, at this stage of the process, a well implant (not shown) may be performed. The implant will introduce the desired dopant into the silicon 302 within and below the STI trench 320. The well implant may be n-type or p-type, depending on the desired polarity of the FET which will be fabricated.

Generally, the steps illustrated in and described with respect to FIGS. 3A-3E are conventional STI FET processing steps.

As can be seen in FIG. 3E, the result of the nitride strip is that a lower portion 322a of the of the STI fill 322 is within the trench 320, and an upper portion 322b of the STI fill 322 extends out of the substrate, through the pad oxide 312 and further extends beyond the pad oxide 312 (where it was previously surrounded by nitride 314). The upper portion 322b of the STI fill 322 has a width W1, equal to the width of the opening 316 that was formed through the nitride 314 and pad oxide 312.

FIG. 3F illustrates a next step in the process. The pad oxide 312 is stripped, such as with a wet etch. Since the STI fill 322 is also oxide, it too will etch. Generally, wet etches remove material isotropically (substantially uniformly in all directions).

As a result of the pad oxide strip, the upper portion 322b of the STI fill 322 becomes thinned (less wide), such as by 10-20 nm, resulting in the upper portion 320b' (prime) having a width of W7, such as 5-20 nm. (The un-thinned upper portion 322b of the STI fill is shown in dashed lines).

As can be observed, as a result of the pad oxide strip, a "divot" (notch) 324 is formed, extending (for example) 5-20 nm into the substrate 302, and surrounding the thinned upper portion 322b' of the STI fill, on both of its side (interior and exterior) surfaces.

FIG. 3G illustrates a next step in the process. An epitaxial (epi) layer 330 of silicon (Si) or silicon germanium (SiGe) is formed, on the top surface of the silicon 302. This layer 330 may have an exemplary thickness of 5-20 nm. For epitaxially-grown silicon, the thickness can easily be greater. For epitaxial SiGe, problems with defects may occur when growing an epitaxial layer in excess of 20 nm. In order for the epi layer 330 to be usable as an active silicon region (RX), it should be at least 5 nm thick.

As can be seen in FIG. 3G, the epi layer 330 grows laterally, as well as vertically, covering (and filling) the divot 324, extending over an (inner) edge of the trench all the way to the thinned upper portion 322b' of the STI oxide 322. The lateral growth of epi layer 330 is facilitated when the substrate 302 is single crystal silicon, having a <100> orientation (Miller index). The thickness of the epi layer 330 should be at least 5 nm, to provide sufficient lateral growth to be effective. The divot 324 helps to make the sidewall of the RX 330 open.

The epi layer 330 increases the effective RX area, for a given STI (trench oxide) morphology. In FIG. 3G it can be seen that the active silicon area RX now has a width W8, which is greater than the "original" spacing W3 between the tops of the STI trenches. For example, using the numbers set forth above, the width W8 of the active silicon region RX may be 210-220 nm, as contrasted with W3=200 nm–an increase of 10-20 nm.

For an active silicon area RX having a width W8 of 220 nm, for a given STI trench size, morphology and layout, this represents a 10% increase in usable area for fabricating devices, such as FETs for W3=200 nm.

Note in FIG. 3G that a "pitch" dimension (also referred to as "RX-to-RX" distance, or pitch) may be defined as the distance "W4" between two identical points (such as the center of) two adjacent trenches (320), and that this dimension is the same as in FIG. 2, for purposes of comparison.

It should be noted that, if the substrate 302 were to have a <110> RX orientation, epi growth would be substantially limited to the vertical (thickness) direction, and the desired result of widening the RX area would not be achieved. The <111> orientation, for example, is a slow growth plane that retards overgrowth, which has other advantages, but which is generally not useful for the present invention.

At this stage of the process, the upper portion 322b' of the STI oxide 322 may be planarized, but without (for example) a nitride hard mask in place to act as an etch stop, the STI may become undercut. Therefore, the upper portion 322b' of the STI oxide 322 ought to be planarized at a later stage in the overall fabrication process.

The result of the steps shown in and described with respect to FIGS. 3A-3G is a substrate prepared for fabricating a field effect transistor (FET), having an epitaxial silicon (or SiGe) layer overhanging (extending partially over) the STI, thereby providing increased active silicon area (RX) for device (such as FET) fabrication.

The epitaxial layer constitutes an active silicon region (RX) extending over the STI trench. Junction capacitance of an FET device fabricated on the RX may be reduced since part of the active silicon layer (RX) is disposed on STI fill. An effective width of the device is increased, therefore performance may be improved with same density. Isolation is not degraded since RX-to-RX distance is same at bottom.

FIG. 3H illustrates (enlarged) a portion of the substrate 302, having an STI trench filled with oxide 322, and an epi layer 330 on the top surface of the substrate, overhanging the STI trenches (extending over edges of the trenches), as described above. An active silicon area RX is defined between two trenches (which, as discussed before, may be considered to be one trench surrounding the RX area), with an FET 340 (compare 100, FIG. 1B) fabricated in the epi layer 330.

The epi layer 330 extends partially over the trench, increasing the effective RX area, as described above. Conceivably, the epi layer could continue to be grown so that it completely covers the STI trench. This is generally not desirable, since it is desired to maintain at least some, such as at least 15 nm of insulation (oxide) between adjacent RX areas.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a shallow trench isolation (STI) region, comprising:
   providing a silicon substrate having a surface, the substrate having a <100> crystal orientation;
   providing the substrate with a pad oxide layer on the surface of the substrate and a nitride layer over the pad oxide layer;
   etching to form STI trenches extending into the silicon substrate from the surface thereof;
   filling the STI trenches with oxide;
   forming a notch in the oxide layer extending into the silicon substrate;
   forming an epitaxial layer selected from the group consisting of silicon and silicon-germanium on a surface of the substrate, and growing the epitaxial layer in a lateral direction such that the epitaxial layer is extending partially over the STI trenches and fills the notch, the epitaxial layer constituting an active silicon region;
   the method further comprising:

prior to etching to form the STI trenches, forming openings through the nitride layer and pad oxide layer, said openings extending to the surface of the substrate;

after filling the STI trenches with oxide and filling the notch with the epitaxial layer, performing a chemical mechanical polishing (CMP) step such that the epitaxial layer in the notch is planarized to the level of the oxide in the trench; and fabricating a field effect transistor (FET) device on the epitaxial layer wherein an effective width of the FET device is increased.

2. A method of fabricating a field effect transistor (FET), comprising:

providing a silicon substrate having a surface;

providing the substrate with an oxide layer on the surface of the substrate and a nitride layer over the oxide layer;

etching to form STI trenches extending into the substrate from the surface thereof;

filling the STI trenches with oxide;

forming a notch in the oxide layer, said notch extending into the silicon substrate;

forming an epitaxial layer comprising silicon on a surface of the substrate, and growing the epitaxial layer in a lateral direction such that the epitaxial layer is extending partially over the STI trenches, thereby filling the notch with the epitaxial layer, and further comprising:

after filling the STI trenches with oxide and filling the notch with the epitaxial layer, performing a chemical mechanical polishing (CMP) such that the epitaxial layer in the notch is planarized to the level of the oxide in the trench.

3. The method of claim 2, wherein:

the step of forming an epitaxial layer comprises forming an epitaxial layer comprising silicon (Si) or silicon-germanium (SiGe).

4. The method of claim 2 wherein:

the step of forming an epitaxial layer comprises forming an epitaxial layer that constitutes an active silicon region (RX) extending over the STI trench.

5. A method of fabricating a shallow trench isolation (STI) region on a silicon substrate, comprising:

depositing an oxide layer on the substrate;

depositing a nitride layer on the oxide layer;

removing a portion of the oxide layer and nitride layer to expose a portion of the substrate;

etching to form trenches extending into the substrate from the surface thereof;

filling the trenches with oxide;

removing the nitride layer;

removing a portion of the oxide layer with a wet etch;

forming a notch in the oxide layer, said notch extending into the silicon substrate;

forming an epitaxial layer comprising silicon on a surface of the substrate, and growing the epitaxial layer in a lateral direction such that the epitaxial layer is extending partially over the STI trenches and fills the notch;

forming an active area on the epitaxial layer;

fabricating a field effect transistor, wherein the field effect transistor is disposed on the epitaxial layer and occupies the active area, and further comprising:

after filling the trenches with oxide and filling the notch with the epitaxial layer, performing a chemical mechanical polishing (CMP) such that the epitaxial layer in the notch is planarized to the level of the oxide in the trench.

6. The method of claim 5, wherein the step of forming a notch in the oxide layer comprises forming a notch with a depth ranging from about 6 nanometers to about 19 nanometers.

7. The method of claim 5, wherein the step of forming an epitaxial layer comprises forming an epitaxial layer that fills the notch.

8. The method of claim 5, wherein the step of forming an epitaxial layer comprises forming an epitaxial layer having a thickness ranging from about 6 nanometers to about 19 nanometers.

* * * * *